(12) United States Patent
Meier et al.

(10) Patent No.: US 6,262,359 B1
(45) Date of Patent: Jul. 17, 2001

(54) ALUMINUM ALLOY BACK JUNCTION SOLAR CELL AND A PROCESS FOR FABRICATION THEREOF

(75) Inventors: Daniel L. Meier; Hubert P. Davis, both of Pittsburgh; Ruth A. Garcia, Irwin; Jalal Salami, West Mifflin, all of PA (US)

(73) Assignee: Ebara Solar, Inc., Large, PA (US)

( * ) Notice: Subject to any disclaimer, the term of this patent is extended or adjusted under 35 U.S.C. 154(b) by 0 days.

(21) Appl. No.: 09/414,990

(22) Filed: Oct. 7, 1999

Related U.S. Application Data

(60) Provisional application No. 60/124,797, filed on Mar. 17, 1999.

(51) Int. Cl.$^7$ .......................... H01L 31/068; H01L 31/04
(52) U.S. Cl. .................. 136/256; 136/255; 136/261; 136/258; 257/432; 257/437; 257/461; 257/464; 438/57; 438/69; 438/72; 438/83; 438/89; 438/98
(58) Field of Search ................................ 136/255, 256, 136/261, 258; 257/432, 437, 461, 464; 438/57, 69, 72, 83, 89, 98

(56) References Cited

U.S. PATENT DOCUMENTS

| | | | |
|---|---|---|---|
| 3,895,975 | * 7/1975 | Lindmayer | 136/255 |
| 4,056,879 | * 11/1977 | Lindmayer | 438/89 |
| 4,106,047 | * 8/1978 | Lindmayer | 136/255 |
| 4,131,486 | * 12/1978 | Brandhorst, Jr. | 136/255 |
| 4,226,017 | * 10/1980 | Lindmayer | 135/256 |
| 4,916,503 | 4/1990 | Uematsu et al. | 257/436 |
| 5,538,564 | * 7/1996 | Kaschmitter | 136/255 |
| 5,641,362 | * 6/1997 | Meier | 136/256 |
| 5,951,742 | * 10/1999 | Tange et al. | 136/256 |
| 5,973,260 | * 10/1999 | Tange et al. | 136/256 |
| 6,071,753 | * 6/2000 | Arimoto | 438/57 |

FOREIGN PATENT DOCUMENTS

| | | |
|---|---|---|
| 0776051 | 5/1997 | (EP). |
| WO 97/13280 | 4/1997 | (WO). |

OTHER PUBLICATIONS

Hu et al, Solar Cells from Basic to Advanced Systems, McGraw–Hill (1983), pp. 81–83.*
Salami, Jalal, et al., *Elsevier Science,* Solar Energy Materials and Solar Cells 48, "Self–aligned locally diffused emitter (SALDE) silicon solar cell," (1997) pp.:159–165.

* cited by examiner

Primary Examiner—Alan Diamond
(74) Attorney, Agent, or Firm—Squire, Sanders & Dempsey LLP

(57) ABSTRACT

A process for fabricating a solar cell is described. The process includes: (1) providing a base layer, (2) fabricating an emitter layer of p-type conductivity on a same side as the non-illuminated surface of the base layer to provide a strongly doped p-type emitter layer and a p-n junction between the n-type base layer and the p-type emitter layer. The base layer of the present invention has n-type conductivity and is defined by an illuminated surface and a non-illuminated surface. The illuminated surface has light energy impinging thereon when the solar cell is exposed to the light energy and the non-illuminated surface is opposite the illuminated surface.

30 Claims, 3 Drawing Sheets

ALUMINUM ALLOY BACK JUNCTION SOLAR CELL AND A PROCESS FOR FABRICATION THEREOF

REFERENCE TO PRIORITY DOCUMENT

This application claims priority to U.S. Provisional Patent Application No. 60/124,797, filed Mar. 17, 1999, which is incorporated herein by reference for all purposes.

BACKGROUND OF THE INVENTION

The present invention relates to an improved solar cell and a process for fabricating thereof. More particularly, the present invention relates to a solar cell including a p-n junction located near a non-illuminated surface of the solar cell and a process for fabricating thereof.

Solar cells are widely used because they convert easily accessible energy from a light source, such as the sun, to electrical power to operate electrically driven devices, e.g., calculators, computers, and heaters used in homes. FIG. 1 shows a cross-sectional view of a layered stack that makes up a conventional silicon solar cell 10. Conventional silicon solar cell 10 typically includes a p-n junction 24 sandwiched between a p-type base layer 18 and an n-type layer 16, which is located near an illuminated (front) surface 11. The term "illuminated surface," as used herein refers to the surface of a conventional solar cell that is exposed to light energy when the solar cell is active or under operation. Thus, the term "non-illuminated surface" refers to a surface that is opposite the illuminated surface. The basic structure of p-n junction 24 includes a heavily-doped (about $10^{20}$ cm$^{-3}$) n-type emitter layer (n$^+$) 16 at or near the illuminated surface 11 and disposed above a moderately-doped (about $10^{15}$ cm$^{-3}$) p-type base layer (p) 18. Commercial embodiments of conventional solar cells typically include an optional anti-reflective coating 14 and a p$^+$ layer 20 that is formed between p-type base layer 18 and p-type silicon contact 22.

A typical depth of p-n junction 24 from the top of the n$^+$ emitter layer 16 measures about 0.5 µm. A shallow front p-n junction 24 is desired in order to facilitate the collection of minority carriers that are created on both sides of p-n junction 24. Each photon of light that penetrates into p-type base layer 18 and is absorbed by base layer 18 surrenders its energy to an electron in a bound state (covalent bond) and thereby frees it. This mobile electron, and the hole in the covalent bond it left behind (which hole is also mobile), comprise a potential element of electric current flowing from the solar cell. In order to contribute to this current, the electron and hole cannot recombine, but rather are separated by the electric field associated with p-n junction 24. If this happens, the electron will travel to n-type silicon contact 12 and the hole will travel to p-type silicon contact 22.

In order to contribute to the solar cell current, photogenerated minority carriers (holes in the n$^+$ emitter layer and electrons in the p-type base layer) should exist for a sufficiently long time so that they are able to travel by diffusion to p-n junction 24 where they are collected. The average distance over which minority carriers can travel without being lost by recombining with a majority carrier is called the minority carrier diffusion length. The minority carrier diffusion length generally depends on such factors as the concentration of defects in the silicon crystal (i.e. recombination centers) and the concentration of dopant atoms in the silicon. As the concentration of either defects or dopant atoms increases, the minority carrier diffusion length decreases. Thus, the diffusion length for holes in the heavily-doped n$^+$ emitter layer 16 is much less than the diffusion length for electrons in moderately-doped p-type base layer 18.

Those skilled in the art will recognize that the n$^+$ emitter layer 16 is nearly a "dead layer" in that few minority charge carriers created in emitter layer 16 are able to diffuse to p-n junction 24 without being lost by recombination. It is desirable to have n$^+$ emitter layer 16 that is shallow or as close to surface of emitter layer 16 as possible for various reasons. By way of example, a shallow emitter layer allows relatively few photons to be absorbed in n$^+$ emitter layer 16. Furthermore, the resulting photogenerated minority carriers created in n$^+$ emitter layer 16 find themselves close enough to p-n junction 24 to have a reasonable chance of being collected (diffusion length >junction depth).

Unfortunately, in the conventional solar cell design, the depth of n$^+$ emitter layer is limited and cannot be as shallow as desired. Metal from emitter contacts 12, especially those formed by screen-printing and firing, can penetrate into p-n junction 24 and ruin or degrade it. The presence of metal in the p-n junction 24 "shorts" or "shunts" the junction. Therefore, although a shallow and lightly-doped n$^+$ emitter layer 16 is desired in order to enhance the current produced by the cell, in practice, however, n$^+$ emitter layer 16 is relatively deeper and more heavily-doped than desired to avoid shunting p-n junction 24. Consequently, in conventional solar cells, the deep location of n$^+$ emitter layer 16 compromises the amount of current produced by the cell.

What is needed is a structure and process for fabricating a silicon solar cell, which has a high minority carrier diffusion length, eliminates shunting of the p-n junction and does not compromise the amount of current produced.

SUMMARY OF THE INVENTION

In one aspect, the present invention provides a solar cell. The solar cell includes a base layer having dopant atoms of n-type conductivity and being defined by an illuminated surface and a non-illuminated surface. The illuminated surface has light energy impinging thereon when the solar cell is exposed to the light energy and the non-illuminated surface is opposite the illuminated surface. The solar cell further includes a back surface emitter layer that is made from an aluminum alloy to serve as a layer of p-type conductivity. The solar cell further still includes a p-n junction layer disposed between the non-illuminated surface of the base layer and the back surface layer.

In another aspect, the present invention provides a process for fabricating a solar cell. The process includes: (1) providing a base layer, (2) fabricating an emitter layer of p-type conductivity on a same side as the non-illuminated surface of the base layer to provide a strongly doped p-type emitter layer and a p-n junction between the n-type base layer and the p-type emitter layer. The base layer of the present invention has n-type conductivity and is defined by an illuminated surface and a non-illuminated surface. The illuminated surface has light energy impinging thereon when the solar cell is exposed to the light energy and the non-illuminated surface is opposite the illuminated surface.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings in which.

DESCRIPTION OF THE PREFERRED EMBODIMENTS

The present invention will now be described in detail with reference to the presently preferred embodiments as illustrated in accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

It is important to bear in mind that a minority carrier electron diffusion length (i.e. electrons in p-type silicon) is generally different from a minority carrier hole diffusion length (i.e. holes in n-type silicon) for a given doping concentration. This difference may depend on the nature of the crystalline defect, which may act as a recombination center. In dendritic web silicon, for example, the primary defects are precipitates of silicon oxide which nucleate on dislocation cores. The interface between the silicon oxide precipitate and the surrounding silicon carries a positive charge because of the mismatch of the atomic structure of the two materials. A negatively charged minority carrier electron is attracted to such a positively charged interface. Such a defect can capture and hold an electron until one of the numerous majority carrier holes wanders by the defect whereupon the electron can fall into the hole in a recombination event.

The present invention therefore recognizes that for a solar cell substrate layer, n-type doping may be desirable to achieve a higher minority carrier diffusion length than that obtained with p-type doping. A solar cell substrate having n-type conductivity requires an n-type base layer. A p-n junction was, therefore, fabricated employing the n-type base layer and an emitter layer at the illuminated side that includes boron, which is a practical choice for a p-type dopant.

Unfortunately, it was found that boron diffusions frequently leave a stained silicon surface because of the formation of boron-silicon compounds. Such a stain seriously degrades the appearance of the surface of a solar cell. Boron stains may be removed at the expense of additional and unwanted processing steps such as thermal oxidation of the stained surface followed by chemically removing the thermal oxide. Thus, according to the findings of the present invention, for silicon materials in which n-type doping gives higher minority carrier diffusion length than does p-type doping, the desirability of a front p-n junction is offset by the presence of a boron stain for the p-type emitter layer.

Figure 1:
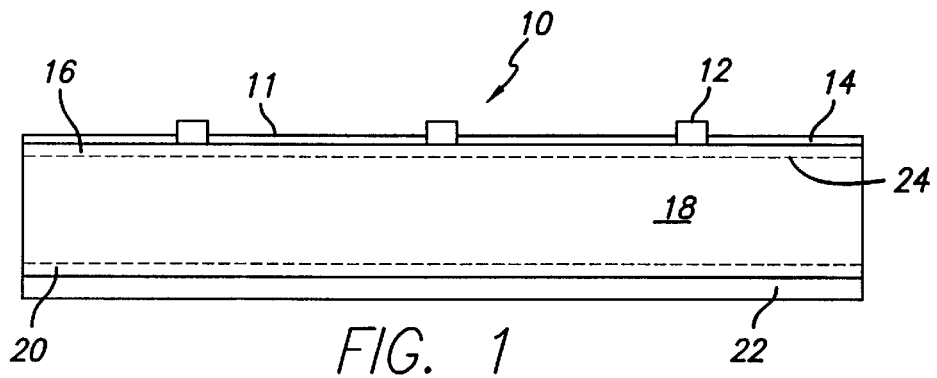
FIG. 1 shows a cross-sectional view of a conventional solar cell.

Referring back to FIG. 1, commercial solar cells 10 have an $n^+pp^+$ structure. The n-type emitter layer 16 is commonly made using phosphorus diffusion (in which staining is not a problem), the silicon substrate is doped p-type, and back silicon surface 20 is typically doped $p^+$ to promote ohmic contact with contact metal layer 22. An ohmic contact has a low resistance. The voltage developed across an ohmic contact has a linear relationship to the current flowing through the contact. In contrast, the voltage developed across a rectifying contact has a non-linear relationship to the current flowing through the contact. An aluminum-silicon alloy may be used to provide the $p^+$ doping and the back metal contact. More importantly, the commercial solar cell 10 has p-n junction 24 located at the front of the cell. As explained above, therefore, $n^+$ emitter layer 16 is forced to be deeper than desired to avoid shunting the front junction. If a silicon material with superior minority carrier diffusion length with n-type doping is to be used with a front p-n junction, p-type emitter layer is boron-doped to be practical. Boron doping, as explained above, gives a stained surface, which degrades cell appearance and which can only be removed with additional and unwanted processing.

Figure 2:
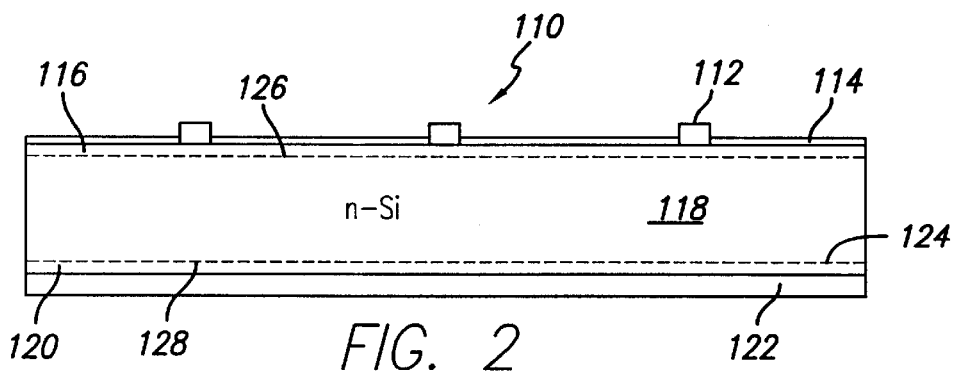
FIG. 2 shows a cross-sectional view of a solar cell, in accordance with an embodiment of the present invention.

The present invention, therefore, provides a p-n junction located at the back end of the solar cell. FIG. 2 shows a solar cell layer stack 110, according to one embodiment of the present invention, that has the p-n junction located at the back end (near the non-illuminated surface of the base layer), so it is impossible for the front metal contacts 112 to shunt the p-n junction. Since aluminum may be the choice of dopant in the silicon $p^+$ layer, it is also impossible for the aluminum to shunt the junction.

Solar cell layer stack 110 includes a base layer 118 of n-type conductivity, which is defined by an illuminated surface (front or top surface) 126 and a non-illuminated surface (back or bottom surface) 128. A portion of base layer 118 near illuminated surface 126 is passivated by a shallow $n^+$ layer 116, which is typically formed by phosphorus diffusion into a silicon layer. This embodiment, therefore, realizes the advantage of the conventional $n^+$ layer and does not suffer from boron staining. An optional anti-reflective (AR) coating 114 is disposed atop $n^+$ layer 116. If the coating is present as shown in FIG. 2, silver contacts 112 fire through AR coating 114 to reach the surface of $n^+$ silicon layer 116.

A p-n junction 124 is formed at non-illuminated surface 128 or the interface between base layer 118 and an aluminum doped silicon layer 120, which functions as a $p^+$ emitter layer in the solar cell layer stack of the present invention. An aluminum-silicon eutectic metal layer 122, which results when aluminum is alloyed with silicon, is disposed beneath $p^+$ layer 120 and serves as a self-aligned contact to $p^+$ emitter layer 120. It is noteworthy that boron doping is absent from the solar cell structure of FIG. 2, so that there is no boron stain to compromise the appearance of the front surface.

The placement of the p-n junction at the back side of cell 110 is a unique feature of solar cell 110 shown in FIG. 2. It should be borne in mind that no other current silicon solar cell design employs such an aluminum alloy back junction. Furthermore, the depth of $n^+$ layer 116 is of no real concern regarding shunting because p-n junction 124 is at the back of cell 110.

In accordance with one embodiment, n-type base layer 118 is a dendritic web silicon crystal having a resistivity that is generally between about 5 Ω-cm and about 100 Ω-cm, and preferably about 20 Ω-cm. The thickness of the dendritic web silicon substrate crystal is generally between about 30 μm and about 200 μm, and preferably about 100 μm. In order for the cell 110 to operate at a practical energy conversion efficiency level, the hole diffusion length in n-type base layer 118 is, in one implementation of this embodiment, slightly less than the thickness of base layer 118. In a preferred implementation, however, the hole diffusion length is substantially equal to the thickness of base layer 118 and more preferably exceeds the thickness of base layer 118.

Locating the p-n junction near the back of the cell instead of near the front of the cell is counterintuitive to one skilled in the art. It is normally desirable to have the p-n junction near the front of the cell because the number of photons absorbed per unit depth decreases as one proceeds from the illuminated surface toward the back surface. For example, about 52% of the incident photons are absorbed within the first 5 μm of the base layer from the illuminated surface, while about 10% are absorbed within the second 5 μm slice of depth, and about 6% are absorbed within the third 5 μm slice. In fact, about 75% of the incident photons are absorbed within the top 30 μm of the base layer.

Since the absorption of photons results in the generation of electron-hole pairs, and since the minority carrier members of the pairs diffuse to the junction in order to be collected, placing the p-n junction near the illuminated surface is reasonable. As a rule of thumb, those minority carriers created beyond one diffusion length from the junction will not be collected and so will not contribute to the solar cell photocurrent.

FIGS. 3A–3D show important intermediate solar cell structures formed at different stages of a fabrication process, according to one embodiment of the present invention. The illustrated embodiment of the inventive processes may begin when a single crystal silicon substrate of n-type conductivity is fabricated using well-known conventional techniques, e.g., Czochralski, Float-zone, Bridgman, edge defined film-fed growth (EFG), string ribbon growth, cast silicon crystallized by directional solidification, and dendritic web growth. In a preferred embodiment, however, the dendritic web growth technique may be implemented to produce an n-type single crystal substrate.

Figure 3A:
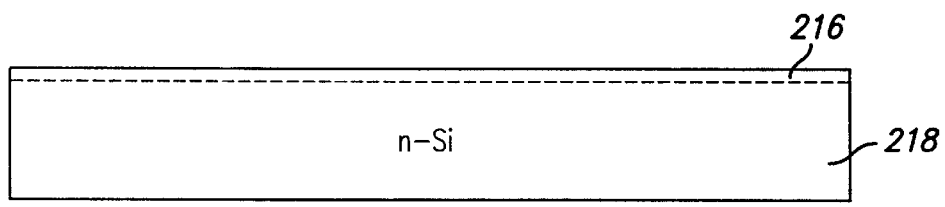
FIGS. 3A–3D show various stages of fabrication, according to one embodiment of the present invention, for the solar cell of FIG. 2.

Referring to FIG. 3A, the n-type single crystal serves as a base layer 218, below which a p-n junction 224 (see FIGS. 3C and 3D) of the solar cell is subsequently formed. In a next step, a strongly doped n-type layer 216 (hereinafter referred to as an "n$^+$ layer") may be formed atop base layer 218 using diffusion processes well known to those skilled in the semiconductor and solar cell fabrication art. In accordance with one embodiment of the present invention, a layer containing phosphorous is applied to the top surface of base layer 218 and the phosphorous atoms are driven into base layer 218 from any heat source. The phosphorous layer is preferably from a screen printed paste or from a liquid dopant, and the heat source is a rapid thermal processing (RTP) unit or a belt furnace maintained at a temperature that is between about 750° C. and about 1050° C. and preferably about 950° C. At these temperatures, the diffusion time may generally be between about 30 seconds to about 30 minutes and preferably be about 5 minutes. As a result, there is formed a phosphorus-doped n$^+$ passivating layer having a thickness that is generally between about 0.1 μm and about 1 μm, preferably about 0.3 μm, with a sheet resistance of generally between about 10 Ω/square and about 200 Ω/square and preferably about 40 Ω/square.

Alternatively, in another embodiment, the top surface of base layer 218 is subjected to phosphorous ion implantation and a portion near the top surface of base layer is transformed into n$^+$ layer 216.

In accordance with yet another embodiment, base layer 218 is passivated with a transparent dielectric layer which may have an appreciable positive or negative charge. In one implementation of this embodiment, the base layer is passivated with a layer of thermally grown silicon dioxide having a thickness of between about 50 Å and about 500 Å, and preferably about 150 Å. In this embodiment, the passivation of base layer 218 may be carried out in a rapid thermal processing unit at temperatures that are generally between about 800° C. and about 1050° C. and preferably about 1000° C. Such temperature treatment is carried out for times that are generally between about 30 seconds and about 30 minutes and preferably about 50 seconds. Regardless of how the n$^+$ layer is passivated, or whether it is passivated those skilled in the art will recognize that at the conclusion of forming n$^+$ layer 216, a high-low junction (n$^+$n) is formed at the top of base layer 218.

Figure 3B:
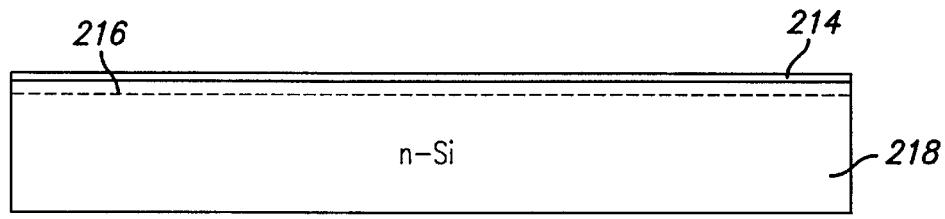

An anti-reflective coating 214 may then be deposited on top of n$^+$ layer 216, as shown in FIG. 3B. By way of example, plasma-enhanced chemical vapor deposition (PECVD) of silicon nitride or atmospheric pressure chemical vapor deposition (APCVD) of titanium dioxide is carried out to form anti-reflective coating 214.

Next, conventional techniques may be employed to deposit an aluminum layer 222 on a bottom surface or non-illuminated surface of base layer 218. According to one embodiment of the present invention, aluminum is deposited by screen printing a pure aluminum paste onto bottom surface of base layer 218. In one implementation of this embodiment, aluminum layer 222 is deposited by screen-printing over nearly the entire back of the cell to a thickness that is generally between about 5 μm and about 30 μm, and preferably about 15 μm. The partially fabricated solar cell is then heated in a radiantly-heated belt furnace to a temperature comfortably above the aluminum-silicon eutectic temperature of about 577° C., e.g., that may generally be between about 700° C. and about 1000° C. and preferably about 800° C., for a long enough duration, e.g., generally between about 0.1 minute and about 10 minutes and preferably about 2 minutes, to facilitate alloying of at least some aluminum from layer 222 with base layer 218. During the alloying process, the temperature treatment inside the belt furnace is high enough so that aluminum may effectively dissolve silicon. At such high temperatures, a portion of the base layer that measures approximately one-third the thickness of the aluminum layer is effectively dissolved to create p$^+$ layer 220 shown in FIG. 3C. By way of example, at about 800° C., a 15 μm thick aluminum layer 222 dissolves a 5 μm portion of a silicon base layer. Consequently, p$^+$ layer 220 is silicon doped with aluminum and contact layer 222 is an alloy that is about 88% aluminum by weight and about 12% silicon by weight the eutectic composition.

Figure 3C:
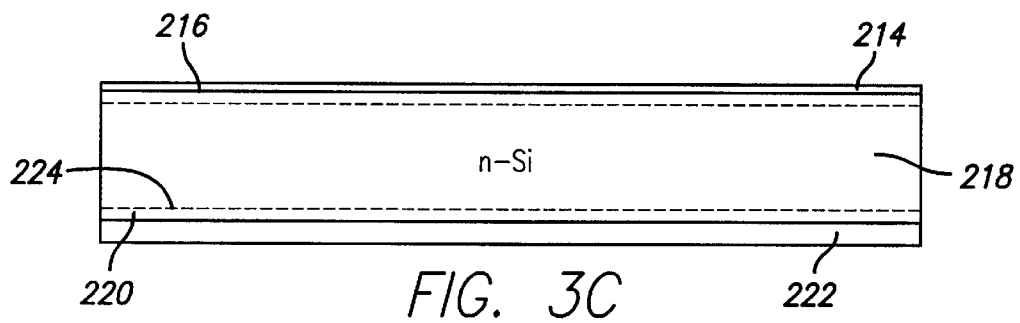

The p$^+$ emitter layer is created as described hereinafter. As the silicon cools, it continues to solidify or grow onto the underlying silicon, also incorporating a modest amount of the aluminum dopant, on the order of between about $10^{18}$ and about $10^{19}$ aluminum atoms per cubic centimeter. The concentration of aluminum atoms is significantly less than the concentration of silicon atoms, which is about 10,000 times larger at about $5 \times 10^{22}$ atoms per cubic centimeter. As shown in FIG. 3C, after cooling the layers, a portion of base layer 218 near the non-illuminated surface is transformed to a strongly doped p-type layer 220 (hereinafter referred to as a "p$^+$ layer"), by liquid phase epitaxy. Some of the silicon that was dissolved becomes part of the aluminum-silicon eutectic layer 222. The silicon that was not dissolved by the aluminum acts as a template for restructuring the silicon crystal as it is epitaxially regrown.

The aluminum-silicon eutectic metal layer 222 is a good conductor (has a low electrical resistance), and serves as a self-aligned metal contact to the solar cell. The thickness of aluminum-silicon eutectic metal layer 222 is generally between about 1 μm and about 30 μm and preferably about 15 μm.

Figure 3D:
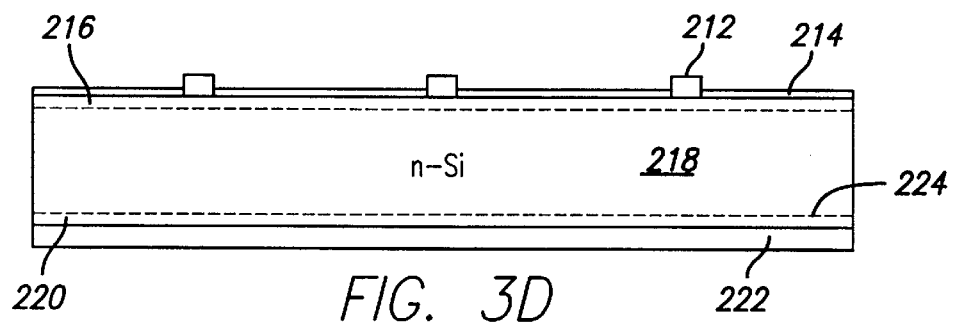

FIG. 3D shows the structure resulting after depositing metal contacts and firing through the optional anti-reflective coating. By way of example, a silver layer is screen-printed onto the n$^+$ layer 216, covering about 7% of the front surface in a grid pattern. Silver may be deposited by screen-printing to a thickness that is generally between about 5 μm and about 20 μm and preferably about 10 μm. The resulting partially fabricated solar cell structure is then run through a belt furnace maintained at a temperature that is generally between about 700° C. and about 900° C. and preferably about 760° C. The time for running the cell through the furnace is short in order to avoid allowing impurities in the silver paste from diffusing into the silicon. In one embodiment of the present invention, the time for running the cell through the belt furnace is between about 0.1 minutes and about 10 minutes. In a preferred embodiment, however, the time is about 40 seconds. The thickness of silver ohmic contacts 212 to n$^+$ layer 216 is generally between about 1 μm and about 20 μm and preferably about 10 μm. If an optional anti-reflective coating is deposited, then the silver layer is fired through the coating. Both operations may (with or without anti-reflective coating) be performed in a radiantly-heated belt furnace. The fabrication steps of the present invention realize high-throughput and low-cost manufacturing.

Figure 4:
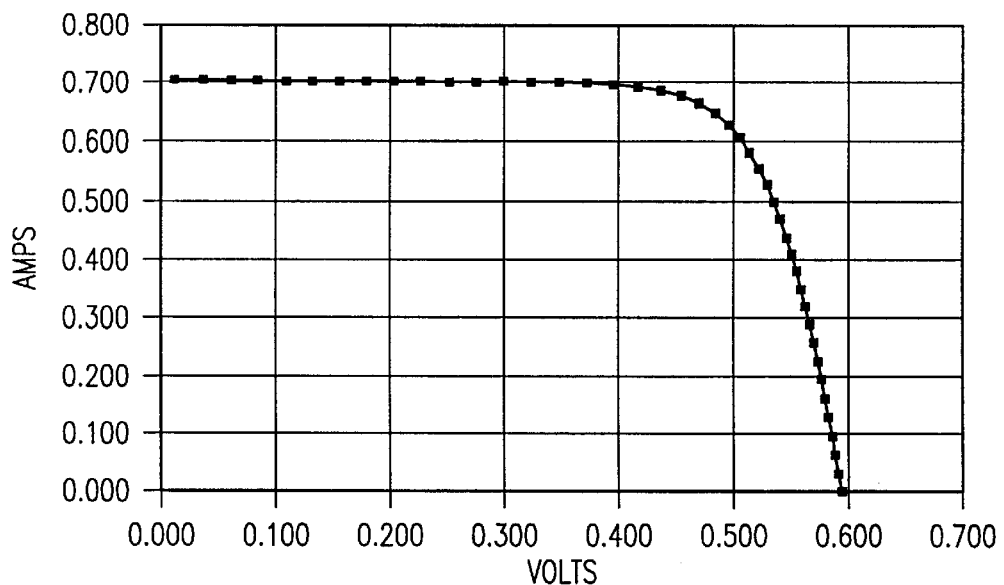
FIG. 4 shows a graph of a measured I-V curve of an aluminum alloy back junction dendritic web solar cell.

FIG. 4 depicts an I-V curve, which shows a light energy to electrical energy conversion efficiency of about 12.5% for an aluminum alloy back junction dendritic web silicon solar cell with full back metal coverage of the present invention. The solar cell employed to obtain the data shown in FIG. 4 has a nominal thickness of about 100 μm and an area of about 25 cm$^2$. Other parameters include a short-circuit current density of about 28.2 mA/cm$^2$, open-circuit voltage of about 0.595 V, and fill factor of about 0.747. The knee of the curve shows a maximum power point, where $V_{mp}$ is about 0.480V and $I_{mp}$ is about 0.653 A.

Figure 5:
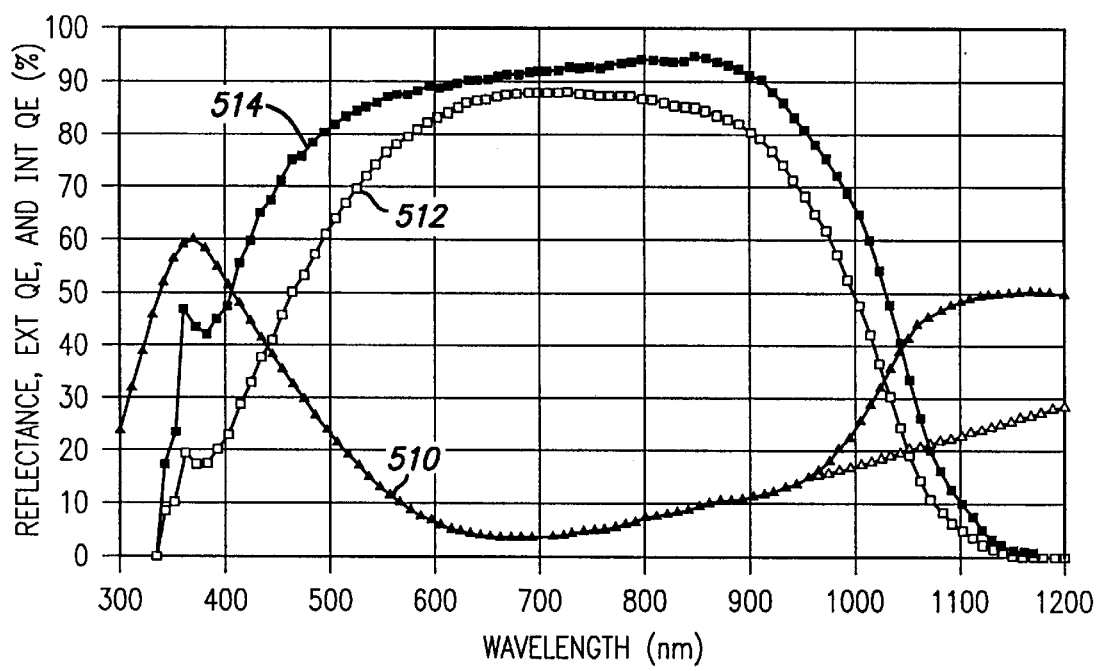
FIG. 5 shows a graph of internal quantum efficiency of an aluminum alloy back junction dendritic web solar cell.

FIG. 5 depicts measurements of spectral reflectivity (solid triangles) 510, external quantum efficiency (open squares) 512, and internal quantum efficiency (solid squares) 514 for the solar cell of FIG. 4. Measured reflectivity indicates that about 47% of the long wavelength (>950 nm) light is reflected from the aluminum-silicon eutectic metal layer at the back surface. This reflected light then gets a second pass through the silicon and adds to the overall efficiency. Calculation of the internal quantum efficiency using the one-dimensional finite element model PC 1 D indicates a hole diffusion length of about 200 μm in the base of this cell. This is double the cell thickness, as required for good performance. The internal quantum efficiency curve has a positive slope over the range of about 500 nm to about 850 nm, indicating that the p-n junction is at the back of the cell, which is also noteworthy. In a conventional solar cell, the internal quantum efficiency curve would show a negative slope, indicating that the p-n junction is at the front of the cell.

Figure 6:
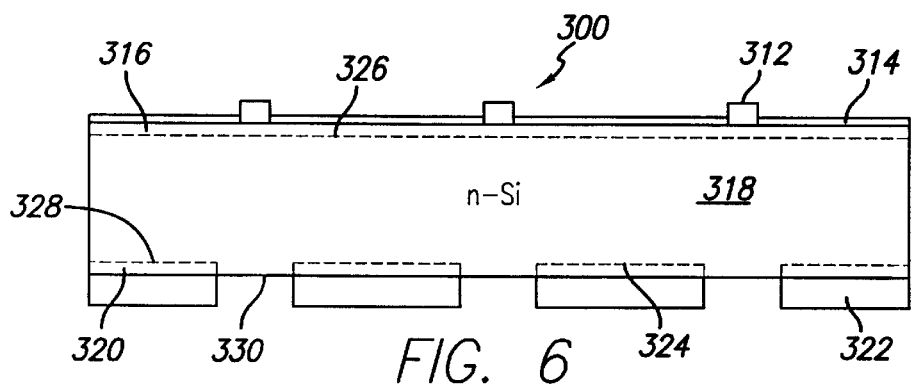
FIG. 6 shows a cross-sectional view of a solar cell, in accordance with another embodiment of the present invention, with partial metal coverage on the back side of the solar cell.

FIG. 6 shows a solar cell layer stack 300, in accordance with another embodiment of the present invention, that is substantially similar to the solar cell 110 of FIG. 2, except that solar cell 300 has only part of the back surface converted to a p-type layer, as indicated by sections 320, and covered with metal, as indicated by sections 322. Solar cell layer stack 300, accordingly, includes a base layer 318 of n-type conductivity, which is defined by an illuminating surface (front or top surface) 326 and a non-illuminating surface (back or bottom surface) 328. A portion of base layer 318 near illuminated surface 326 is passivated by a shallow n$^+$ layer 316, which can typically be formed by phosphorus diffusion into a silicon layer. An optional anti-reflective (AR) coating 314 can be disposed on top n$^+$ layer 316. Metal contacts 312 are illustrated as being deposed through anti-reflective (AR) coating 314. A p-n junction 324 is located at the non-illuminating surface 328. Thus, solar cell 300 is referred to as having "partial" metal coverage on the back side as opposed to have "full" metal coverage, as shown in FIG. 2 for solar cell 110, where the entire back surface is covered with metal. The partial metal coverage design of FIG. 6 eliminates bowing of the thin cells, which results from a differential thermal contraction between the silicon and the aluminum-silicon eutectic metal layer upon cooling from the eutectic temperature of about 577° C. It is important to bear in mind that such bowing sometimes occurs when full back metal coverage is used. The segmented metal also reduces the cost of aluminum. The exposed n-type base layer surfaces 330 between metal islands at the back may be passivated in order to obtain respectable energy conversion efficiency. By way of example, the passivation step may be performed after the aluminum alloying step by growing a thermal oxide of about 115 Å thickness in a rapid thermal processing unit at about 1000° C. for about 50 seconds. An anti-reflective coating may not be applied in this preliminary effort. Efficiencies up to about 6.8% were obtained for 25 cm$^2$ dendritic web silicon cells with screen-printed metals but without anit-reflective coating. The expected efficiency with an anti-reflective coating is about 9.9%.

Figure 7:
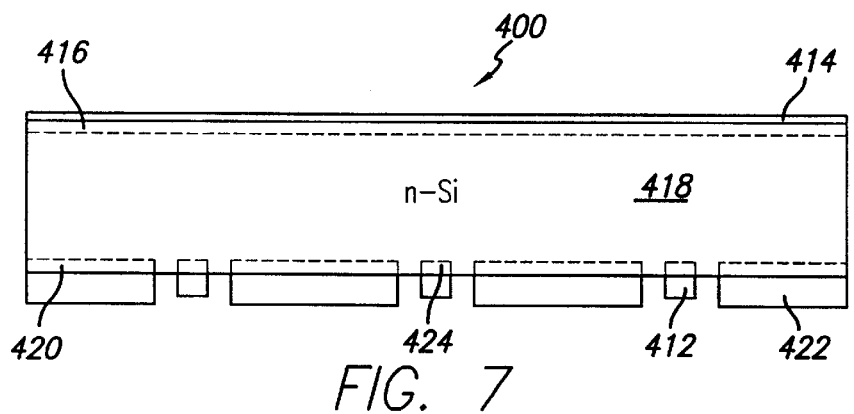
FIG. 7 shows a cross-sectional view of a solar cell, in accordance with yet another embodiment of the present invention, whose contacts to the base layer are at the back of the cell in interdigitated fashion.

FIG. 7 depicts a solar cell layer stack 400, according to yet another embodiment of the present invention, that is substantially similar to the solar cell 300 of FIG. 6, except that solar cell 400 has n-type contacts 412 to the n-type base 418 layer moved from the front of the cell to the back of the cell in an interdigitated fashion. Similarly, solar cell layer stack 400 includes a n$^+$ layer 416, an optional AR coating 414, p$^+$ layer 420 and metal layer 422. For more information on interdigitated contacts, further reference may be made to U.S. patent application Ser. No. 60/045,673, filed on May 6, 1997, to Daniel L. Meier and Hubert P. Davis, entitled, "Self-doping Negative and Positive Electrodes for Silicon Solar Cells and Other Devices," and issued U.S. Pat. No. 5,641,362 to Daniel L. Meier entitled, "Structure and Fabrication Process for an Aluminum Alloy Junction Self-Aligned Back Contact Silicon Solar Cell," which are hereby incorporated by reference in their entirety for all purposes.

This structure shown in FIG. 7 has the added advantage of reducing to zero the shadowing of the front surface by contacts. Interconnecting cells in a module is also expected to be simpler with both contacts on the back side of the cell in that surface mount technology can be used. The n$^+$ regions 424 adjacent silver contacts 412 may be formed in a separate step. Alternatively, the source of this n-type dopant can be the contact material itself if a self-doping contact metal, such as a silver-antimony alloy, is used rather than pure silver. A prototype dendritic web silicon solar cell of this type with screen-printed metals, titanium dioxide anti-reflective coating and about 2.5 cm$^2$ area had an efficiency of about 10.4%.

It is noteworthy that although the present invention is described in terms of a silicon crystal substrate and aluminum, there is no reason why other substrate and conductive materials cannot be similarly employed. Furthermore, it can therefore be appreciated that new and novel structure and processes for fabricating an aluminum alloy back junction solar cell has been described. It will be appreciated by those skilled in the art that, given the teaching herein, numerous alternatives and equivalents will be seen to exist which incorporate the invention disclosed hereby. As a result, the invention is not to be limited by the foregoing exemplary embodiments, but only by the following claims.

What is claimed is:

1. A solar cell, comprising:
   a base layer including dopant atoms of n-type conductivity and being defined by an illuminated surface and a non-illuminated surface, said illuminated surface having light energy impinging thereon when said solar cell is exposed to said light energy and said non-illuminated surface is opposite said illuminated surface;
   a back surface emitter layer including an aluminum alloy contact and serving as a layer of p-type conductivity; and
   a p-n junction layer disposed between said non-illuminated surface of said base layer and said back surface emitter layer
   wherein said back surface emitter layer is an uninterrupted layer covering a significant portion of said non-illuminated surface.

2. The solar cell of claim 1, further comprising a strongly doped n-type layer that is disposed adjacent the illuminated surface of the base layer.

3. The solar cell of claim 2, wherein the strongly doped n-type layer includes phosphorous atoms.

4. The solar cell of claim 2, further comprising an anti-reflective coating layer that is disposed adjacent the strongly doped n-type layer.

5. The solar cell of claim 1, wherein a diffusion length of a hole through said base layer is slightly less than the thickness of the base layer.

6. The solar cell of claim 1, wherein a diffusion length of a hole through said base layer is substantially equal to the thickness of said base layer.

7. The solar cell of claim 1, wherein a diffusion length of a hole through the base layer exceeds the thickness of the base layer.

8. The solar cell of claim 1, wherein the n-type base layer is fabricated using one technique selected from the group consisting of cast silicon crystallized by directional solidification, edge-defined film-fed growth, string ribbon growth, Czochralski, Float-zone, Bridgman and dendritic web growth.

9. The solar cell of claim 1, wherein the n-type base layer is a dendritic web silicon layer.

10. The solar cell of claim 1, wherein the n-type base layer has a resistivity that is between about 5 Ω-cm and about 100 Ω-cm.

11. The solar cell of claim 1, wherein the n-type base layer has a resistivity that is about 20 Ω-cm.

12. The solar cell of claim 1, wherein the thickness of the n-type base layer is between about 30 $\mu$m and about 200 $\mu$m.

13. The solar cell of claim 1, wherein the thickness of the n-type base layer is about 100 $\mu$m.

14. The solar cell of claim 1, wherein the aluminum alloy contact is an aluminum-silicon eutectic metal layer.

15. The solar cell of claim 1, wherein the aluminum alloy contact has a thickness that is between about 1 $\mu$m and about 30 $\mu$m.

16. The solar cell of claim 1, wherein the aluminum alloy contact is a continuous layer that substantially covers the non-illuminated surface of the back surface emitter layer.

17. A solar cell, comprising:
   a base layer including dopant atoms of n-type conductivity and being defined by an illuminated surface and a non-illuminated surface, said illuminated surface having light energy impinging thereon when said solar cell is exposed to said light energy and said non-illuminated surface is opposite said illuminated surface;
   a back surface emitter layer including an aluminum alloy contact and serving as a layer of p-type conductivity;
   a p-n junction layer disposed between said non-illuminated surface of said base layer and said back surface emitter layer;
   a strongly doped n-type layer disposed adjacent the illuminated surface of the base layer;
   an anti-reflective coating layer disposed adjacent the strongly doped n-type layer; and
   metal contacts penetrating through the anti-reflective coating to reach the strongly doped n-type layer.

18. The solar cell of claim 17, wherein the metal contacts include silver and serve as ohmic contacts to the base layer.

19. The solar cell of claim 17, wherein the metal contacts have a thickness of 1 $\mu$m to 20 $\mu$m.

20. A process for fabricating a solar cell, comprising:
   providing a base layer, said base layer having n-type conductivity and being defined by an illuminated surface and a non-illuminated surface, said illuminated surface having light energy impinging thereon when said solar cell is exposed to said light energy and said non-illuminated surface is opposite said illuminated surface;
   fabricating an emitter layer of p-type conductivity on the same side as said non-illuminated surface of said base layer to provide a strongly doped p-type emitter layer and a p-n junction between said n-type base layer and said strongly doped p-type emitter layer
   wherein fabricating said emitter layer comprises pro ding an aluminum layer on said non-illuminated surface of said base layer and alloying said aluminum layer with at least a portion of said base layer to transform said portion of said base layer into said emitter layer and
   wherein said strongly doped p-type emitter layer is an uninterrupted layer covering a significant portion of said non-illuminated surface.

21. The process of claim 20, wherein said providing the base layer includes fabricating a crystalline silicon substrate of n-type conductivity using one technique selected from the group consisting of Czochralski, Float-zone, Bridgman, cast silicon crystallized by directional solidification, edge-defined film-fed growth (EFG), string ribbon growth, and dendritic web growth.

22. The process of claim 21, wherein said providing the base layer includes fabricating a crystalline silicon substrate of n-type conductivity using dendritic web growth.

23. The process of claim 20, wherein said providing said aluminum layer includes screen-printing the aluminum on the non-illuminated side of the base layer.

24. The process of claim 20, wherein said alloying is accomplished at a temperature of between about 700° C. and about 1000° C.

25. The process of claim 24, wherein said alloying is accomplished by maintaining said temperature for a time that is between about 1 minute and about 30 minutes.

26. The process of claim 20, wherein the illuminated surface of the base layer is passivated by a phosphorus-doped layer having a thickness of between about 0.1 µm and about 1 µm.

27. The process of claim 26, further comprising forming an anti-reflective coating on at least part of the phosphorus-doped layer, said anti-reflective coating including titanium dioxide or silicon nitride.

28. The process of claim 20, wherein n-type metal contacts are formed on the illuminated side of the base layer to provide ohmic contact to the base layer.

29. The process of claim 20, wherein said aluminum layer formed in said alloying substantially covers the back side of the emitter layer.

30. The process of claim 20, further comprising passivating substantially all exposed illuminated and non-illuminated surfaces of the base layer with a dielectric layer.

* * * * *

UNITED STATES PATENT AND TRADEMARK OFFICE
CERTIFICATE OF CORRECTION

PATENT NO.  : 6,262,359 B1
DATED       : July 17, 2001
INVENTOR(S) : Daniel L. Meier et al.

It is certified that error appears in the above-identified patent and that said Letters Patent is hereby corrected as shown below:

<u>Column 10,</u>
Line 39, change "wherein fabricating said emitter layer comprises pro ding" to -- wherein fabricating said emitter layer comprises providing --

Signed and Sealed this

Sixteenth Day of April, 2002

Attest:

*Attesting Officer*

JAMES E. ROGAN
*Director of the United States Patent and Trademark Office*